(12) United States Patent
Tan

(10) Patent No.: US 6,303,969 B1
(45) Date of Patent: Oct. 16, 2001

(54) SCHOTTKY DIODE WITH DIELECTRIC TRENCH

(76) Inventor: Allen Tan, 120 Bentley Sr., Mtn. View, CA (US) 94040

( * ) Notice: Subject to any disclaimer, the term of this patent is extended or adjusted under 35 U.S.C. 154(b) by 0 days.

(21) Appl. No.: 09/071,310

(22) Filed: May 1, 1998

(51) Int. Cl.[7] .................... H01L 27/095; H01L 29/47; H01L 29/812; H01L 31/07; H01L 31/108
(52) U.S. Cl. .................... 257/484; 257/471; 257/483
(58) Field of Search .................... 257/471, 475, 257/476, 483, 484

(56) References Cited

U.S. PATENT DOCUMENTS

| | | | |
|---|---|---|---|
| 3,274,453 | * | 9/1966 | Sikina .................... 257/476 |
| 4,223,327 | * | 9/1980 | Nara et al. .................... 257/783 |
| 4,339,869 | * | 7/1982 | Reihl et al. .................... 438/526 |
| 4,636,833 | * | 1/1987 | Nishioka et al. .................... 257/476 |
| 5,109,256 | * | 4/1992 | De Long .................... 257/476 |
| 5,612,232 | * | 3/1997 | Thero et al. .................... 438/571 |
| 5,622,877 | * | 4/1997 | Ashkinazi et al. .................... 438/571 |
| 5,672,898 | * | 9/1997 | Keller et al. .................... 257/383 |

FOREIGN PATENT DOCUMENTS 54-127280 * 10/1979 (JP) .

* cited by examiner

Primary Examiner—Eddie C. Lee
Assistant Examiner—Allan R. Wilson
(74) Attorney, Agent, or Firm—Tung & Associates

(57) ABSTRACT

An improved diode or rectifier structure and method of fabrication is disclosed involving the incorporation in a Schottky rectifier, or the like, of a dielectric filled isolation trench structure formed in the epitaxial layer adjacent the field oxide layers provided at the edge of the active area of the rectifier, for acting to enhance the field plate for termination of the electric field generated by the device during operation. The trench is formed in a closed configuration about the drift region and by more effectively terminating the electric field at the edge of the drift region the field is better concentrated within the drift region and acts to better interrupt reverse current flow and particularly restricts leakage current at the edges.

10 Claims, 1 Drawing Sheet

SCHOTTKY DIODE WITH DIELECTRIC TRENCH

FIELD OF THE INVENTION

The present invention generally relates to the structure and fabrication of Schottky diodes or rectifiers and, more particularly, to a dielectric isolation trench structure for such devices.

BACKGROUND OF THE INVENTION

Various forms of Schottky rectifiers and their manners of operation are discussed in detail in U.S. Pat. No. 5,612,567 to B. J. BALIGA. Essentially, such rectifiers are fabricated from a first semiconductor N+ substrate layer having a metal cathode contact on one surface and a second epitaxially grown semiconductor − layer on its opposite surface. The second − layer acts as the drift region and typically has discrete P+ regions located in its opposite surface in the drift region. A metal anode contact is formed on the opposite surface of the second − layer and metal/semiconductor junctions form Schottky contact regions between the P+ regions. As noted in the Patent, the lowered operating voltages presently required for reduced power consumption and increased energy efficiency call for a decreased on-state voltage drop across the rectifier while maintaining high forward-biased current density levels and minimizing the reverse-biased leakage current. However, in Schottky barrier rectifiers there is a tradeoff between the forward-biased voltage drop and the reverse-biased leakage current so that it is difficult to minimize both at the same time. The doping level in the semiconductor region is used to affect the Schottky barrier height, but, while the use of a higher the doping level lowers the forward-biased voltage drop, it also lowers the reverse-biased breakdown level because of impact ionization.

PRIOR ART

Among the approaches for dealing with the problem of leakage currents, U.S. Pat. No. 5,365,102 is cited and discussed, for its disclosure of a trench MOS barrier Schottky (TMBS) rectifer wherein better than theoretically ideal breakdown voltage characteristics are achieved using a trench structure that causes the occurrence of charge coupling between majority charge carriers in mesa-shaped portions of the epitaxial/drift region of the trench structure and metal lining the insulated sidewalls of the trench. This charge coupling produces a redistribution of the electric field profile under the Schottky contact, which profile change results in achieving a breakdown voltage of about 25 Volts when an appropriate doping concentration for the drift region and selected oxide thickness are used. This compares quite favorably to the 9.5 Volts breakdown for an ideal abrupt parallel-plane rectifier. Additionally, because the peak electric field at the metal-semiconductor contact in TMBS rectifiers is reduced relative to an ideal rectifier, electric leakage current is also reduced. Contrary to the result obtained by increasing the depth of the trench, increasing the oxide thickness decreases the breakdown voltage. However, increasing the trench depth beyond a given depth will no longer increase the breakdown voltage beyond 25 Volts.

An earlier and apparently simpler approach is cited as being found in U.S. Pat. No. 4,982,260 to H. R. CHANG ET AL which describes the fabrication of a power rectifier with trenches, which rectifier is in the form of a p-i-n diode with Schottky contact regions. It is mentioned that Schottky diodes exhibit lower forward voltage drops and faster turn-off speeds than p-i-n diodes, this is at the expense of exhibiting high reverse leakage currents that increase significantly for increasing values of reverse voltage. Here, respective trenches are formed between the P+ regions extending into the drift region and containing the anode electrode conforming thereto with the Schottky contact region formed between a portion of the electrode at the lowest portion of each trench and the drift region. Field oxide layers are provided to partially overlie the extreme P+ regions at the edge of the active area of the rectifier for acting as a field plate for termination of the electric field generated by the device during operation.

PROBLEM TO BE SOLVED

The foregoing approaches for dealing with the leakage current problem in Schottky diodes and rectifiers, while offering their own advantages, still leave room for improvement in achieving an efficient and simplified rectifier structure that results in decreased on-state voltage drop across the rectifier while maintaining high forward-biased current density levels and minimizing the reverse-biased leakage current.

OBJECTS

It is therefore an object of the present invention to provide a Schottky diode or rectifier having a structure that will operate to produce a decreased on-state voltage drop across the rectifier while maintaining high forward-biased current density levels and minimizing the reverse-biased leakage current.

SUMMARY OF THE INVENTION

In accordance with the present invention an improved diode or rectifier structure and method of fabrication is presented embodying the incorporation in a Schottky diode or rectifier, or the like, of an insulator or dielectric filled isolation trench structure formed in the epitaxial layer at the edge of the active area of the rectifier, for acting to enhance the field plate for termination of the electric field generated by the device during operation. The isolation trench is formed in a closed configuration about the drift region to more effectively terminate the electric field at the edge of the drift region. As a result the electric field is better concentrated within the drift region and acts to better interrupt reverse current flow and particularly restricts leakage current at the edges.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention is directed to providing an improved diode or rectifier structure, such as in a Schottky rectifier, and a method of fabrication, whereby an isolation trench structure is formed in the epitaxial layer of the Schottky diode containing the drift region and adjacent the field oxide layers provided at the edge of the active area of the rectifier, which trench structure is in a closed configuration about the drift region and filled with an insulator or dielectric. The insulating isolation trench acts to enhance the effect of the field plate in terminating the electric field generated by the device about its edge during operation.

Figure 1:
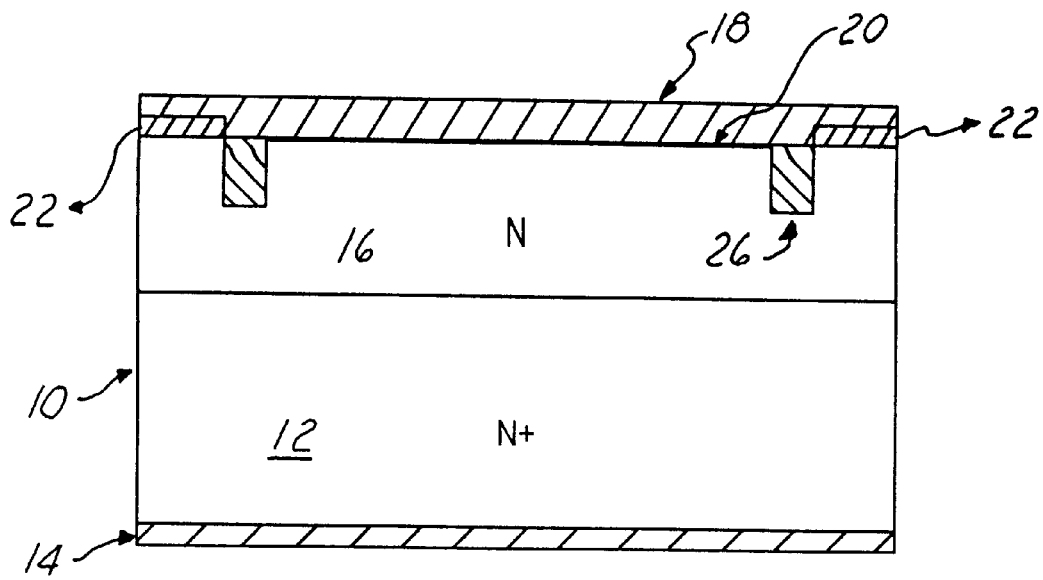
FIG. 1 is a diagrammatic view in elevation illustrating a rectifier structure in accordance with the present invention.

Referring initially to FIG. 1, a preferred embodiment of a rectifier 10 constructed in accordance with the invention is shown wherein a first semiconductor N+ substrate layer 12 is formed on one surface with a first conductive layer 14, typically of a multiple metal such as titanium/aluminum/silver, which is applied in ohmic contact with the substrate 12 to act as a cathode electrode. The substrate layer 12 is preferably of silicon heavily doped with N+ conductivity type dopant, such as arsenic or antimony. A second semiconductor layer 16 is epitaxially grown on the opposite surface of the first semiconductor N+ layer 12 and lightly doped with a − conductivity type dopant such as phosphorus. The doping concentration and thickness of layer 16 are selected so that it can support high reverse voltages without current conduction and thus act as the drift region of the rectifier. A Schottky diode or rectifier is then produced by depositing a barrier metal layer such as of molybdenum in contact with the other or upper surface of the epitaxial layer 16 to form a Schottky barrier contact 20. A conductive layer 18, typically of a multiple layer metal, such as titanium/nickel/silver, or a single layer metal such as aluminum, is deposited on top of the Schottky barrier layer 20 to form an anode contact.

Prior to depositing the Schottky barrier layer 20, an insulating layer 22, such as of silicon nitride, silicon oxide, silicon oxynitride, etc., may be formed at the edges of the active surface of the rectifier, i.e., on the upper surface of the epitaxial layer 16. The insulating layer 22 is grown or deposited as a layer over the epitaxial layer 16; a layer of photoresist is deposited and then patterned by known masking techniques. The insulating layer 22 acts as a field plate for terminating the electric field generated by the device when a voltage is applied across the anode and cathode electrodes 14 and 18 during operation.

Figure 2:
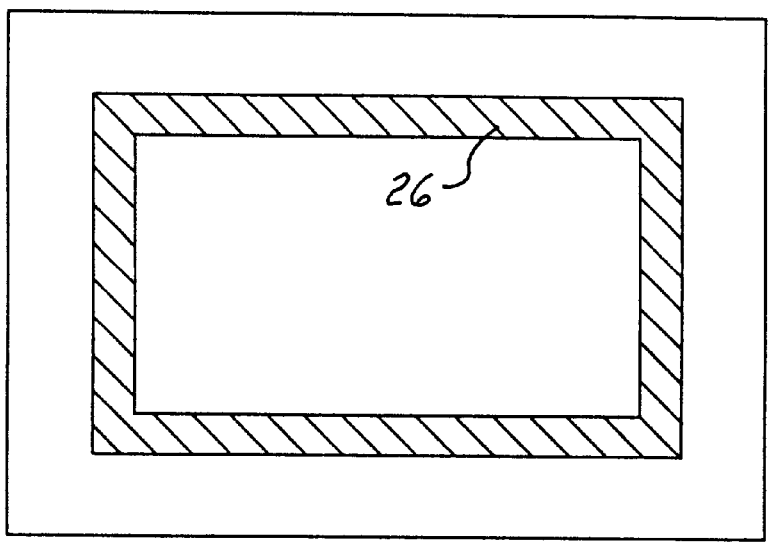
FIG. 2 is a top view of the rectifier structure shown in FIG. 1 illustrating the closed configuration of the dielectric trench in accordance with the present invention.

In accordance with the invention, an isolation trench structure 26 is formed in the surface of the epitaxial layer 16 adjacent the insulating layer 22 at the edge of the surface. As seen in FIG. 2, the trench structure 26 is in a closed configuration about the drift region. During fabrication, after the photoresist is patterned, the trench structure 26 is etched into the epitaxial layer 16 using a known method, such as reactive ion etching (RIE) or wet etching, to a depth of about 1 $\mu$ and width of about 1–2 $\mu$, short of the interface 28 between the substrate 12 and epitaxial 16 layers. Anisotropic etching is preferred for better performance. The trench 26 is then filled with an insulator or dielectric 24 of a material such as an oxide, polymer, glass, or nitride, and combinations thereof, to form an insulating isolation trench that acts to enhance the effect of the field plate 22 in terminating the electric field generated by the device about its edge during operation.

It will be seen that the incorporation of a surrounding trench in the surface of the epi layer about the edge of the active area of the Schottky rectifier in accordance with the invention enables the construction of a SCHOTTKY diode of the same or a comparable size as those of the prior art and capable of producing a decreased on-state voltage drop across the rectifier while maintaining high forward-biased current density levels and minimizing the reverse-biased leakage current.

The present invention has been described in an illustrative manner, but it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations of the invention, such as fast recovery diodes.

The embodiment of the invention in which an exclusive property or privilege is claimed are defined in the following claims.

What is claimed is:

1. A rectifier comprising:
   a first semiconductor layer of a first conductivity type having a first surface and an opposite surface;
   a Schottky barrier contact on said first surface defining an active area;
   a first electrode layer in conductive contact with said Schottky barrier contact;
   a second semiconductor layer of said first conductivity type having a lower resistivity than said first semiconductor layer and with one surface disposed adjacent said opposite surface of said first layer along said active area and having another opposite surface;
   a second electrode layer in conductive contact with said another opposite surface of said second semiconductor layer;
   trench means, formed in said first surface within an edge of and surrounding said active area beneath said first electrode layer, for receiving an insulating material to limit current leakage from the edge of said active area; and
   oxide layers formed on said first surface at the edge of said active area with said trench means disposed between said edge and said oxide layers.

2. A Schottky diode comprising:
   an epitaxial layer having a Schottky barrier contact layer disposed on one surface thereof;
   a first electrode layer disposed on said epitaxial layer over said Schottky barrier contact layer;
   a substrate having one surface with a second electrode disposed thereon and the other surface interfacing with said epitaxial layer;
   an insulating layer disposed on the edge portion of said one surface of said epitaxial layer beneath said first electrode layer; and
   an isolation trench formed in said epitaxial layer between said insulating layer and said Schottky barrier contact layer for terminating the electric field at the edge of said Schottky barrier contact layer to concentrate said electric field during operation of said diode.

3. A Schottky diode as in claim 2 further comprising an insulating material filling said isolation trench.

4. A Schottky diode as in claim 3, wherein said insulating material is selected from the group consisting of an oxide, polymer, glass, and nitride, and combinations thereof.

5. A Schottky diode as in claim 2 wherein said isolation trench is formed in a closed configuration about said Schottky barrier contact layer.

6. A Schottky diode as in claim 2 wherein said insulating layer comprises a field oxide.

7. In a rectifier comprising:
   one semiconductor layer of a first conductivity type having a first surface and a second surface;
   one electrode layer in conductive contact with said first surface of said one semiconductor layer;

another semiconductor layer of said first conductivity type having a higher resistivity than said one semiconductor layer and with a third surface disposed adjacent said second surface of said one semiconductor layer and having a fourth surface;

a Schottky barrier contact layer on said fourth surface defining an active area; and another electrode layer over said fourth surface and in conductive contact with said Schottky barrier contact layer: the improvement comprising:

a trench, formed in said fourth surface within an edge of and surrouding said active area beneath said another electrode layer;

oxide layers on said fourth surface at the edge of said active area with said trench disposed therebetween; and an insulating material filling said trench, whereby current leakage from the edge of said active area is limited.

8. In a rectifier according to claim 7, further comprising layers on the edge of said fourth surface of a material selected form the group consisting of silicon nitride, silicon oxide, and silicon oxynitride.

9. In a rectifier according to claim 7, wherein said Schottky barrier contact layer comprises molybdenum.

10. In a rectifier according to claim 7, wherein said electrodes comprise aluminum or a multiple metal selected from the group consisting of titanium/aluminum/silver and titanium/nickel/silver.

* * * * *